US010120964B2

(12) United States Patent
Walls

(10) Patent No.: US 10,120,964 B2
(45) Date of Patent: Nov. 6, 2018

(54) METHOD OF EVALUATING WIND FLOW BASED ON CONSERVATION OF MOMENTUM AND VARIATION IN TERRAIN

(71) Applicant: One Energy Enterprises LLC, Findlay, OH (US)

(72) Inventor: Elizabeth Walls, Findlay, OH (US)

(73) Assignee: One Energy Enterprises LLC, Findlay, OH (US)

( * ) Notice: Subject to any disclaimer, the term of this patent is extended or adjusted under 35 U.S.C. 154(b) by 0 days.

(21) Appl. No.: 15/880,905

(22) Filed: Jan. 26, 2018

(65) Prior Publication Data

US 2018/0210982 A1 Jul. 26, 2018

Related U.S. Application Data

(63) Continuation of application No. 14/545,619, filed on May 29, 2015, now Pat. No. 9,881,108.

(51) Int. Cl.
*G01P 5/00* (2006.01)
*G06F 17/50* (2006.01)
*G01P 13/04* (2006.01)

(52) U.S. Cl.
CPC ............ *G06F 17/5009* (2013.01); *G01P 5/00* (2013.01); *G01P 13/045* (2013.01)

(58) Field of Classification Search
CPC ................................ G06F 17/5009; G01P 5/00
USPC ................................................. 702/2, 5, 100
See application file for complete search history.

(56) References Cited

U.S. PATENT DOCUMENTS

| 8,483,963 B2 | 7/2013 | Kline |
| 9,881,108 B2 | 1/2018 | Walls |
| 2006/0173623 A1 | 8/2006 | Grzych et al. |
| 2006/0271297 A1 | 11/2006 | Repelli et al. |
| 2012/0065788 A1 | 3/2012 | Harper, III et al. |

(Continued)

OTHER PUBLICATIONS

Jack Kline, "A new and Objective Empirical Model of Wind Flow Over Terrain", AWEA Wind Resource & Project Assessment Workshop, (2007).

(Continued)

*Primary Examiner* — Albert K Wong
(74) *Attorney, Agent, or Firm* — Buchanan Van Tuinen LLC

(57) ABSTRACT

A method of modeling the spatial variation in wind resource at a prospective wind farm site. The method involves a simplified analysis of the Navier-Stokes equation and utilizes data from all of the met sites simultaneously to develop site-calibrated models. The model coefficients, $m_{UW}$ and $m_{DW}$, describe the sensitivity of the wind speed to changes in the upwind and downwind terrain exposure and are defined for downhill and uphill flow. The coefficients are a function of terrain complexity and, since terrain complexity can change across an area, the estimates are performed in a stepwise fashion where a path of nodes with a gradual change in complexity is found between each pair of sites. Also, coefficients are defined for each wind direction sector and estimates are performed on a sectorwise basis. The site-calibrated models are created by cross-predicting between each pair of met sites and, through a self-learning technique, the model coefficients that yield the minimum met cross-prediction error are found.

20 Claims, 9 Drawing Sheets

(56) References Cited

U.S. PATENT DOCUMENTS

| | | |
|---|---|---|
| 2013/0317748 A1 | 11/2013 | Obrecht et al. |
| 2014/0344209 A1 | 11/2014 | Fang et al. |
| 2015/0160373 A1 | 6/2015 | Feldman-Fitzthum et al. |
| 2015/0308416 A1 | 10/2015 | Ambekar et al. |
| 2015/0347922 A1 | 12/2015 | Hamann et al. |
| 2016/0146190 A1 | 5/2016 | Ravindra et al. |
| 2016/0173017 A1 | 6/2016 | Beekmann |
| 2016/0238244 A1 | 8/2016 | Schroter et al. |
| 2016/0305678 A1 | 10/2016 | Pavlovski et al. |
| 2017/0016430 A1 | 1/2017 | Swaminathan et al. |
| 2017/0050656 A1 | 2/2017 | Dasaratha et al. |
| 2017/0067445 A1 | 3/2017 | Carulla |

OTHER PUBLICATIONS

John Bosche, "Wind Flow Modeling Software Comparison," AWEA Wind Resource Assessment Workshop (Sep. 2009).

Elizabeth Walls, "Contiuum Wind Flow Model: Introduction to Model Theory and Case Study Review", (Jan. 19, 2015).

Anthony Bowen and Niels Mortensen, "WAsP Prediction Errors Due to Site Orography", (2004).

Liz Walls and Jack Kline, "Exposure-based Wind Flow Modeling with a Single Met Site", AWEA Wind Resource Seminar, (Dec. 2013).

Liz Walls, "Results of Wind Flow Modeling at Windy Point, ND using Continuum", (Jan. 16, 2015).

METHOD OF EVALUATING WIND FLOW BASED ON CONSERVATION OF MOMENTUM AND VARIATION IN TERRAIN

FIELD OF THE INVENTION

The present invention relates to a method to estimate and predict the spatial variation in wind energy resource at a prospective wind energy site. In particular, the invention utilizes the theory of conservation of momentum (Navier-Stokes) and wind data measured at two or more meteorological (met) towers to develop a wind flow model based on how the upwind and downwind terrain changes between the respective met towers and on whether the wind flow is uphill, downhill, or over a hill.

BACKGROUND OF THE INVENTION

In wind energy resource assessment, it is the primary goal to estimate the annual net energy that could be produced from a potential wind farm. This assessment includes several elements such as a wake loss model, long-term climatic adjustments, and a wind flow model. The wind flow model is the foundation of the wind resource assessment as it is used to estimate the free-stream (un-waked) wind speed distribution across the project area, which is then converted into gross annual energy production. If the wind flow model is flawed or biased, then all subsequent calculations will inherit those errors and the assessment will not be representative of the wind farm's true potential.

A wind flow model is developed by first taking measurements of the wind speed and direction typically at one or more meteorological tower (which could include a physical tower, or could include a remote sensing device such as a LIDAR or SODAR device) sites within the project boundaries. Characteristic wind measurements are collected with anemometers and wind vanes mounted typically at several levels on a tower or mast, called a meteorological (met) tower, or may be collected by a remote sensing device such as a SODAR or LIDAR. As used herein, a meteorological (met) tower is defined to mean any measurement of meteorological characteristics, whether from sensors mounted at one or more heights on a physical tower or from a remote sensing device such as a SODAR or a LIDAR. Prospective wind farm projects often have multiple met towers, although, in some cases, only one tower may be present within the project area. Often, the period of record for on-site measurements is not representative of long-term climatic conditions. To adjust on-site measurements to long-term conditions, project meteorological data is correlated to a long-term reference data set. On-site data is adjusted based on those correlations to reflect long-term climatic conditions. Then a joint frequency distribution of measured wind speed and wind direction is developed for each met tower. The joint frequency distribution is normalized for an average year. One of ordinary skill in the art can develop an accurate representation of climatology at a prospective wind farm meteorological tower site, thus the particulars are not discussed here. Further detail of the measurement and calculation of wind climatology can be found in *Wind Characteristics*, by Janardan Rohatgi and published by the Alternative Energy Institute, West Texas A&M University, 1994, incorporated herein by reference.

Measurements from met towers each represent one point in a project area, and not necessarily where wind turbines will be placed. To account for and predict the wind energy resource across a site, a wind flow model is used. Once characteristic representations of the wind climatology are developed for a particular met tower, the joint frequency distributions are used in a wind flow model to extrapolate and predict the wind energy resource spatially across the project area.

Wind flow across a given area is not typically consistent from point to point. On-site measurements typically show that there is spatial variation in wind speed and direction. Many aspects affect the variation in the wind regime, including trees, shrubs, buildings, and other surface "roughness" elements. Another aspect that affects the wind regime of a given site is the variation in terrain elevation, which is known as "terrain effects." Analysis of wind regimes in areas with complex terrain with large differences in elevation across the site has demonstrated significant differences in the representative frequency distributions at different met towers, indicating that the terrain effects have a large influence upon the local wind climatology. In flatter sites, while the variation in measurements between met towers is smaller, it has been shown that terrain effects are still significant in affecting the spatial wind flow.

There are several different types of commercially-available wind flow models. All use a derived joint frequency distribution representing the climatology at the site of a met tower, elevation data, and other inputs, which can include surface roughness values and forest canopy heights. The wind flow models that are currently most commonly used include linear models and computational fluid dynamics (CFD) models. In general, linear models are viewed as simple and quick to produce estimates but are known to produce estimates with significant error, particularly in complex terrain. One of the most widely used linear models is the Wind Atlas Analysis and Application Program (WAsP), which was developed by Risø DTU, Denmark. WAsP has been documented to have significant error when used to predict the wind flow in sites with slopes more than 20 degrees, as detailed in *WAsP Prediction Errors Due to Site Orography*, by Anthony J. Bowen and Niels G. Mortensen, published by Risø National Laboratory, 2004, incorporated herein by reference.

On the other end of the spectrum, CFD models are considered to be more robust and can produce estimates with lower error. The most well-known CFD software models are Meteodyn and WindSim. CFD models are typically very complex and require extensive training, resources, and knowledge to use to accurately predict wind flow across a site.

Several validation studies have been conducted where linear and CFD models have been compared. In general, there have not been consistent results showing the superiority of either linear or CFD models. Some results that show the WAsP linear model performing as well as or better than the CFD models. However, some studies showed the CFD model producing a lower error than WAsP. In general, it is expected that CFD models should produce a more accurate wind flow model. However, this is not always the case, and the error in CFD models can be substantial.

SUMMARY OF THE INVENTION

The present invention can be viewed as the middle ground between linear and CFD models. Similar to previous wind flow models, the present invention uses the derived wind frequency distribution for a meteorological (met) tower and digital elevation data. The majority of previous wind flow models only have the capability of using a single wind frequency distribution whereas the present invention is capable of using wind frequency distributions from multiple met towers at the same time.

The present invention utilizes all available meteorological tower sites simultaneously to generate site-specific wind flow models that describe the difference in the wind speed from a met site to a target site (for example, a proposed wind turbine location, a grid node if the model is used to create a grid of wind speed estimates, or any other location of interest for which it is desired to estimate the annual average wind speed) based on the difference in the upwind and downwind terrain exposure between the two sites. Exposure is a mathematical representation of elevation differences between the point in question, typically a met tower site or prospective wind turbine site, and the surrounding terrain out to a specified radius. Exposure is disclosed in U.S. Pat. No. 8,483,963, entitled METHOD OF EVALUATING WIND FLOW BASED ON TERRAIN EXPOSURE AND ELEVATION, John Bertrand Kline, incorporated herein by reference.

The invention describes the sensitivity of the wind speed to changes in the upwind (UW) and downwind (DW) terrain exposure by using two coefficients, $m_{UW}$ and $m_{DW}$. The UW coefficient, $m_{UW}$, represents the sensitivity of the wind speed to changes in the UW exposure while the DW coefficient, $m_{DW}$, describes how the wind speed changes as the DW exposure varies. The physics underlying the invention tie back to the theory of conservation of momentum of Navier-Stokes, of which more information can be found in *Fluid Mechanics with Engineering Applications*, $9^{th}$ edition, by Joseph B. Franzini and John E. Finnermore, incorporated herein by reference. By making simplifying assumptions regarding the uniformity of the wind conditions, the invention estimates the wind speed from one met site to another based solely on how the terrain changes between the sites. This innovation does not consider surface roughness or other elements, solely the influence of terrain effect upon wind flow.

Three sets of model coefficients are defined in the invention that represent downhill flow, uphill flow, and induced speed-up over hills. The coefficients are dependent on the level of terrain complexity. Log-log relationships are used to describe the coefficients as a function of terrain complexity. Also, model coefficients are defined for each wind direction sector.

When forming the site-calibrated model, first a default set of model coefficients are used to cross-predict the met tower site wind speeds, and the overall cross-prediction error is determined. Then, using a self-learning algorithm, the coefficient relationships are systematically altered and the relationships that yield the minimum met cross-prediction root mean square (RMS) error are found, which define the site-calibrated model.

The terrain exposure is calculated using four different radii of investigation (for example: 4000, 6000, 8000 and 10,000 m) and a site-calibrated model is formed using the exposures calculated for each radius. These models are then used to form estimates of the wind speed and gross annual energy production (AEP) at the turbine sites and/or at map nodes.

Since the model coefficients vary as a function of terrain complexity, the predictions between sites are conducted in a stepwise fashion where the wind speed is estimated along a path of nodes that have a gradual change in terrain complexity from one met site to another. Between each pair of met sites and from each met site to every turbine site or map node, a path of nodes is created where there is a small change in the exposure and elevation from one node to the next. For each step along the path of nodes, the sectorwise UW and DW model coefficients are determined from the site-calibrated relationships based on the terrain complexity and whether the flow is downhill or uphill. The change in wind speed is then estimated along the path of nodes as the UW and DW exposure changes from the met site to the turbine or map node.

Wind speed and gross energy estimates are formed at the turbine or map node using each met site and each site-calibrated model. Then, based on the similarity of the UW and DW exposure between the predictor met and the target site, wind speed weights are assigned to each estimate. Additionally, the RMS of the met cross-prediction error is found for each site-calibrated model and the RMS error is used as a weight. The final estimate at the turbine or map node is therefore a weighted average of all estimates formed from each met site weighted by the terrain similarity and the RMS error of the met cross-prediction of each site-calibrated model.

BRIEF DESCRIPTION OF THE DRAWINGS

Features and advantages according to embodiments of the invention will be apparent from the following Detailed Description taken in conjunction with the accompanying drawings, in which.

DETAILED DESCRIPTION OF THE INVENTION

Figure 1:
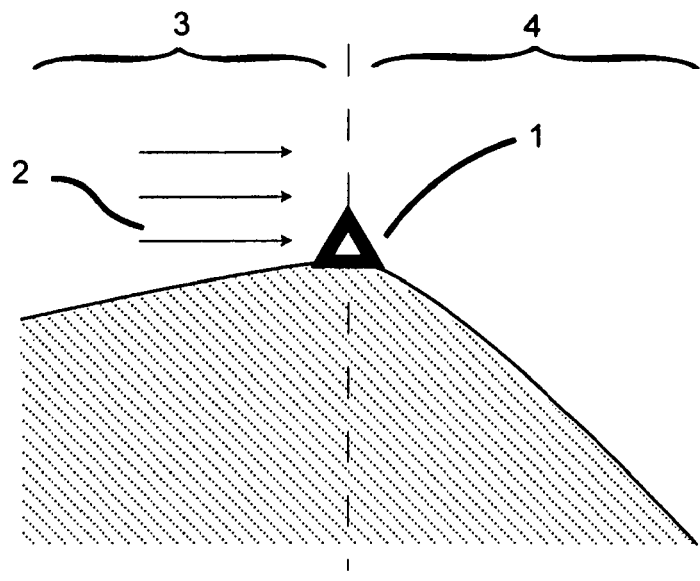
FIG. 1 shows a site with downhill flow with a positive DW exposure.

The invention disclosed herein describes a new model to predict the spatial variation of wind flow at a site. The invention uses derivations of Newton's second law, which states that the change in momentum of a moving fluid is equal to the net force acting on that fluid. The Navier-Stokes equation is used to represent Newton's second law, and is described on pages 190-191 of *Fluid Mechanics with Engineering Applications, 9th Edition,* 1997 by Joseph B. Franzini and John E. Finnermore, and incorporated herein by reference. Further detail on the derivations of the equations behind the present invention from Navier-Stokes can be found in *Continuum Wind Flow Model: Introduction to Model Theory and Case Study Review* by Elizabeth Walls, incorporated herein by reference. In the following discussion, the following variables are defined:

UW: Upwind
DW: Downwind
$\theta$: Slope of terrain.
WS: Wind speed.
WD: Wind direction sector
$X_i$=the $i^{th}$ easting coordinate in the digital elevation model (DEM).
$Y_i$=the $i^{th}$ northing coordinate in the DEM.
$Z_i$=the $i^{th}$ elevation in the DEM.
$X_0$=the easting of the site in question.
$Y_0$=the northing of the site in question.
$Z_0$=the elevation of the site in question.
$R_i$=the distance from the site to the $i^{th}$ coordinate in the DEM.

As referenced in *Continuum Wind Flow Model: Introduction to Model Theory and Case Study Review* by Elizabeth Walls and incorporated herein by reference, in the Navier-Stokes conservation of momentum equation, the effect of changing the UW and DW terrain on the acceleration and therefore the velocity of the wind is a function of the UW and DW terrain slope, $\theta$. In the present innovation, instead of calculating the average terrain slope, an equivalent measurement (terrain exposure) is used. In addition, in the present invention, the vertical pressure gradient force, gravity and velocity flow field are replaced by the coefficients, $m_{DW}$ and $m_{UW}$. This assumes that, for a given wind direction sector and for a given level of terrain complexity, the vertical pressure gradient force, the force of gravity, and the wind speed flow field are constant from one site to another within the project area.

Terrain exposure (or, simply, exposure) is the weighted average elevation difference, Z, between a site and the surrounding terrain within a specified radius of investigation, which is disclosed in U.S. Pat. No. 8,483,963, entitled METHOD OF EVALUATING WIND FLOW BASED ON TERRAIN EXPOSURE AND ELEVATION, John Bertrand Kline, incorporated herein by reference.

$$\text{Exposure} = \frac{\left(\sum_{i=0}^{N} \frac{Z_o - Z_i}{d_{z_o - z_i}}\right)}{\left(\sum_{i=0}^{N} \frac{1}{d_{z_o - z_i}}\right)}$$

In the simplified Navier-Stokes analysis, the term, $\sin \theta$, is the equivalent of the quotient of exposure and the radius of investigation:

$$\sin \theta \equiv \frac{\bar{Z}}{R} = \frac{\text{Exposure}}{R}$$

The equations below show the results of the simplified Navier-Stokes analysis where the flow is downhill DW of the site and is uphill UW of the site. If the wind conditions are approximately uniform for a given wind direction sector and for a certain level of terrain complexity then the vertical pressure gradient, $P_z/\rho$, the force of gravity, g, the wind speed flow field, $$\left(\frac{\partial v_x}{\partial x} + \frac{\partial v_z}{\partial z}\right),$$

and the radius of investigation, R, can all be condensed down to be represented by the linear coefficients, $m_{DW}$ and $m_{UW}$.

$$\Delta WS = \frac{\left(g - \frac{P_z}{\rho}\right)}{\left(\frac{\partial v_x}{\partial x} + \frac{\partial v_z}{\partial z}\right)_{DW}} * \frac{\Delta DW}{R} = m_{DW} * \Delta DW$$

$$\Delta WS = \frac{\left(\frac{P_z}{\rho} - g\right)}{\left(\frac{\partial v_x}{\partial x} + \frac{\partial v_z}{\partial z}\right)_{UW}} * \frac{\Delta UW}{R} = m_{UW} * \Delta UW$$

The net change in wind speed from one site to another can then be estimated by calculating the differences in the UW and DW exposure and multiplying the changes in the UW and DW exposure by the respective coefficients, $m_{DW}$ and $m_{UW}$, as shown below:

$$\Delta WS = m_{UW} * \Delta UW + m_{DW} * \Delta DW$$

Since the model coefficients, $m_{UW}$ and $m_{DW}$, are a function of the terrain complexity, a quantitative representation of the terrain complexity is defined. The terrain complexity is found by creating a grid around the site (i.e. met, turbine, node, or map node) and then calculating the exposure at each node within the gridded area. The calculated exposures are then sorted and the exposure in the top predetermined percentile is deemed the measure of the level of terrain complexity directly surrounding the site. In general, using a P10 exposure has been found to work well as a terrain complexity metric, but other values could be used; for example a P5 or P20 exposure, which would represent the top 5% or top 20% percentiles, respectively. The idea behind terrain complexity is that one can represent and quantify the complexity of the surrounding terrain based on how high the exposure is within the surrounding terrain. Other metrics to quantify terrain complexity may also be used, and method of quantifying terrain exposure described herein is presented by way of example as one possible metric that has been found to work well. One other possible metric to quantify terrain complexity could include the Ruggedness Index (RIX) as used in the WAsP model. Other possible metrics will be evident to one of ordinary skill in the art.

Figure 2:
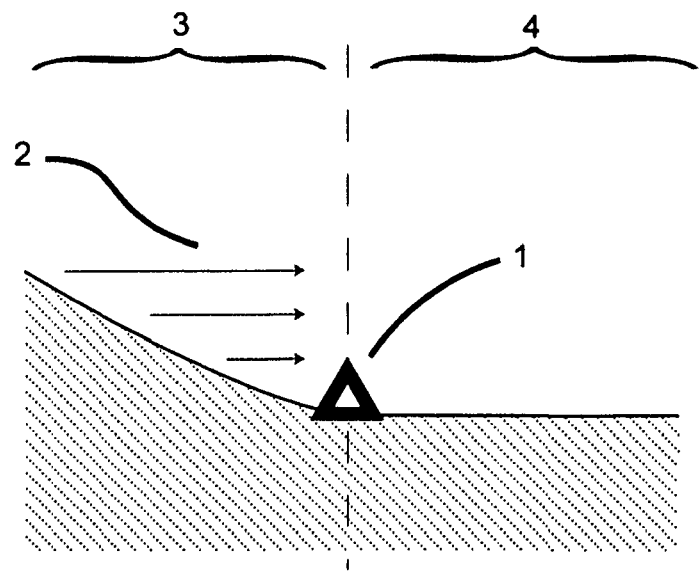
FIG. 2 shows a site with downhill flow with a negative UW exposure.
Figure 3:
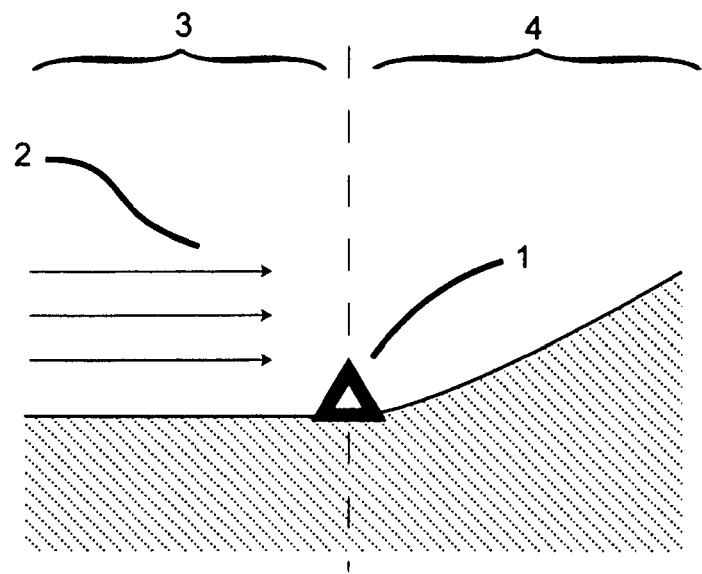
FIG. 3 shows a site with an uphill flow where there is a negative DW exposure.
Figure 4:
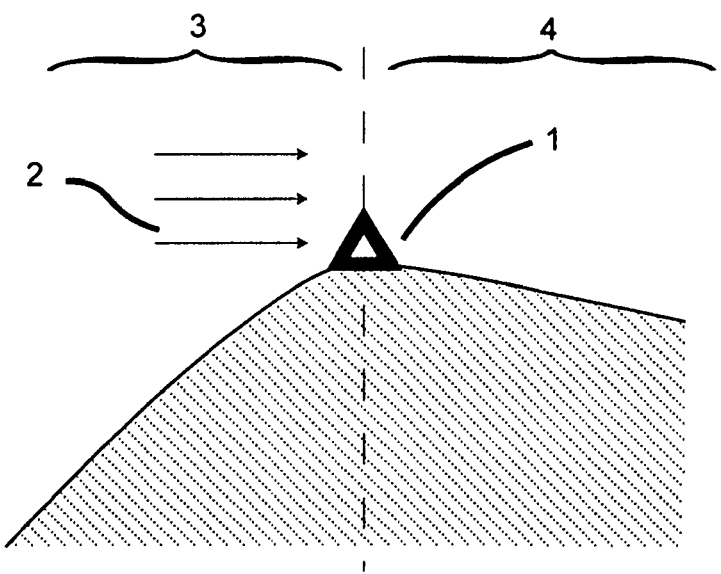
FIG. 4 shows a site with an uphill flow where there is a positive UW exposure (when UW exposure>UW critical).
Figure 5:
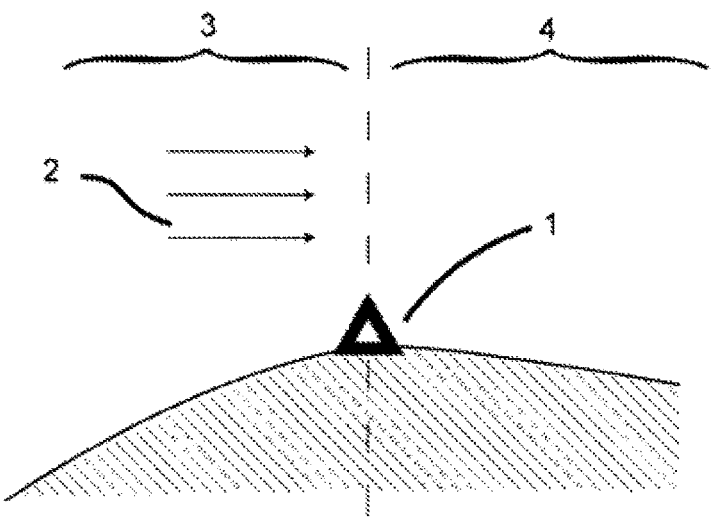
FIG. 5 shows a site where the UW exposure is less than UW critical.
Figure 6:
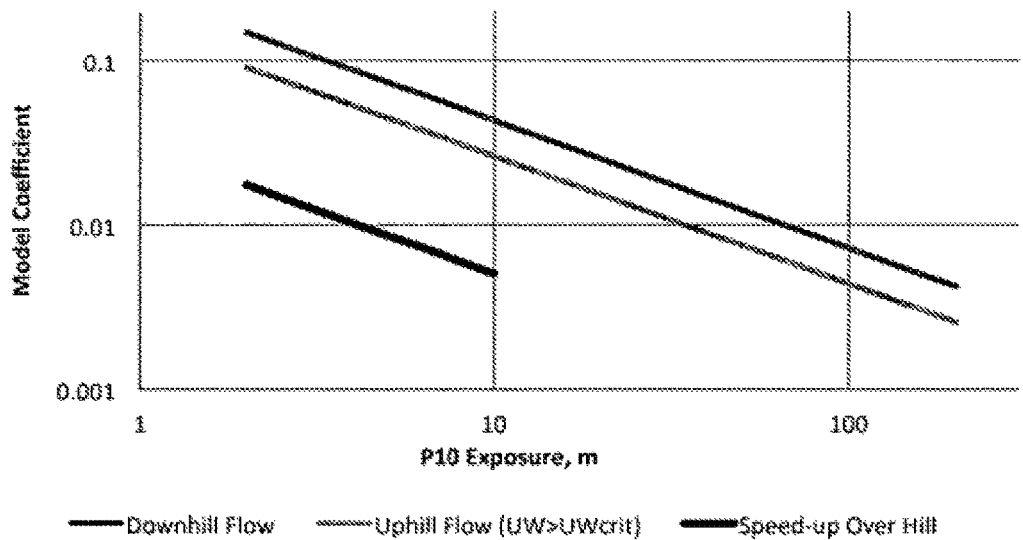
FIG. 6 shows a graphical representation of the log-log relationships for FIGS. 1, 2, 3, 4, and 5.

The model coefficients are defined as a function of terrain complexity in log-log relationships. There are three log-log relationships defined to represent sites with positive or negative UW and DW exposures and for downhill flow, uphill flow where the wind decelerates or induced speed-up over hills. In Scenario 1, the log-log relationship represents sites with downhill flow with a positive DW exposure as shown in FIG. 1, or negative UW exposure, as shown in FIG. 2. In Scenario 2, the site has an uphill flow, where there is a negative DW exposure as shown in FIG. 3, or a positive UW exposure (when UW exposure>UW critical) as shown in FIG. 4. In Scenario 3, a relationship is used to define the induced speed-up caused by a hill where the UW exposure is less than UW critical, as shown in FIG. 5. In FIGS. 1 through 5, 1 is a site of interest (typically a met tower or turbine location), 2 is the direction of the wind, 3 is the upwind exposure and 4 is the downwind exposure. FIG. 6 shows a graphical representation of the log-log relationships for each scenario.

Since the terrain complexity can change across a project area, the model coefficient, which describes the change in wind speed with variations in the exposure, should also vary across the project area. To account for this variability, the present invention creates a path of nodes that have a gradual change in terrain complexity and elevation between two sites (met towers, turbine locations, or other points) when estimating the wind speeds from one site to another. The algorithm selects the path that has the gentlest slope between the two sites and selects nodes located on high points (as opposed to in a valley, for example).

Once a path between the predictor and target site has been found, the wind speed is calculated along the path of nodes and an estimate at the target site is formed. For each node, the UW and DW coefficients are determined from the three log-log relationships, and are based on the terrain complexity and whether the UW and DW exposures are positive or negative.

One of the assumptions in the present innovation is that the mean atmospheric stability, surface roughness and density are constant from one site to another and that only changes in the terrain will alter the wind speed. Since, at some sites, the mean atmospheric stability can be quite different as a function of wind direction, the wind speed is estimated from one site to another on a sectorwise basis where a different set of log-log relationships are defined for each wind direction sector. This allows the model coefficients to be a function of not only terrain complexity but also of mean atmospheric stability.

$$WS_{i,j+1} = WS_{i,j} + m_{UW_{i,j}} * (UW_{i,j+1} - UW_{i,j}) + m_{DW_{i,j}} * (DW_{i,j+1} - DW_{i,j})$$

where i=1 to number of wind direction sectors
where j=1 to number of nodes in path Once the sectorwise wind speed estimates have been formed at the target site, they are combined by multiplying with the wind rose as measured at the predictor met site to form the overall wind speed estimate:

$$WS = \sum_{i=1}^{WD} WS_{i,N} * \text{Wind Rose } Frequency_i$$

For each wind direction sector, three log-log relationships define the model coefficients as a function of the terrain complexity. Since the terrain complexity can change across a project area, the present innovation uses a stepwise approach by creating a path of nodes with a gradual change in complexity and the wind speed is estimated from the met site along the path of nodes to the target site. This is done both when conducting the met cross-predictions and when generating the wind speed estimates at the turbine and/or map node sites.

To find the site-calibrated models, the present invention starts with default log-log relationships that have been established after analyzing data from dozens of project sites and the wind speed between each pair of met sites is cross-predicted. The exposure is calculated using four different radii of investigation and thus four site-calibrated models are created. Then, through a self-learning algorithm, the log-log relationships are systematically altered, both in terms of slope and magnitude, and the set of log-log relationships that generate the lowest met cross-prediction RMS error are found. These site-calibrated models are then used to form the wind speed estimates at the turbine sites and map nodes. The met cross-prediction RMS error is used to estimate the uncertainty of the wind speed estimates.

Once the site-calibrated models have been determined, each met site is used individually to estimate the wind speed at turbine sites or map nodes. A path of nodes with a gradual change in terrain complexity is formed between each met site and the target site and, with four site-calibrated models, four wind speed estimates are formed at the target site using each met site as the predictor thus resulting in a total number of wind speed estimates equal to four (number of site-calibrated models) times the number of met sites.

Often, the terrain at the target site will be more similar, in terms of terrain complexity, to the terrain at certain met sites and weights are assigned to the wind speed estimates to reflect the relative level of terrain similarity between the sites. The UW and DW terrain complexity (TC) is compared between each of the predicting met sites and the target site and a terrain weighting factor for each wind speed estimate, i, is calculated as:

$$\text{Terrain } Weight_i = 1 - \left[ \frac{|\Delta TCDW|_i + |\Delta TCUW|_i}{\sum_{n=i}^{N} |\Delta TCDW|_n + |\Delta TCUW|_n} \right]$$

Also, weights are calculated to reflect the accuracy of the met cross-prediction for each of the site-calibrated models. The RMS weight is calculated as shown below where the model with the lowest RMS error is assigned a weight of 1 and the model with the highest RMS is given a weight of 0.25.

$$\text{RMS } Weight_i = 1 - \frac{0.75 * (RMS_i - MinRMS_i)}{(MaxRMS - MinRMS)}$$

Using the terrain and RMS weighting factors, the wind speed estimates are combined using a weighted average to form the overall wind speed estimate at the target site:

Wind Speed $Weight_i$ = RMS $Weight_i$ * Terrain $Weight_i$ $$\text{Average Wind Speed Estimate} = \frac{\sum_{i=1}^{Num\ Ests.} WS\ Weight_i * WS\ Estimate_i}{\sum_{i=1}^{Num\ Ests.} WS\ Weight_i}$$

To illustrate the present innovation, the following example will be used. The example has complex terrain, with 11 met sites situated across the project area. The 10-minute wind speeds at the top level of each met site were extrapolated to a hub height of 80 m. These extrapolated data sets were used to form the wind speed and wind direction distributions at each site.

The wind speed and wind direction distributions measured at each met site are entered into the present innovation along with 30-m resolution digital elevation data. Four site-calibrated models are formed using radii of investigation of 4000 m, 6000 m, 8000 m, and 10,000 m in the exposure calculation. Other radii of investigation could be used (or a single radius of investigation could be used) but these radii are used herein by way of example. For each model, paths of nodes with gradually changing terrain complexity are found between each pair of met sites and the wind speeds are cross-predicted using the default model coefficients. Then, through a self-learning algorithm, the downhill and uphill model coefficients are systematically altered until the met cross-prediction error reached a minimum value.

Figure 7:
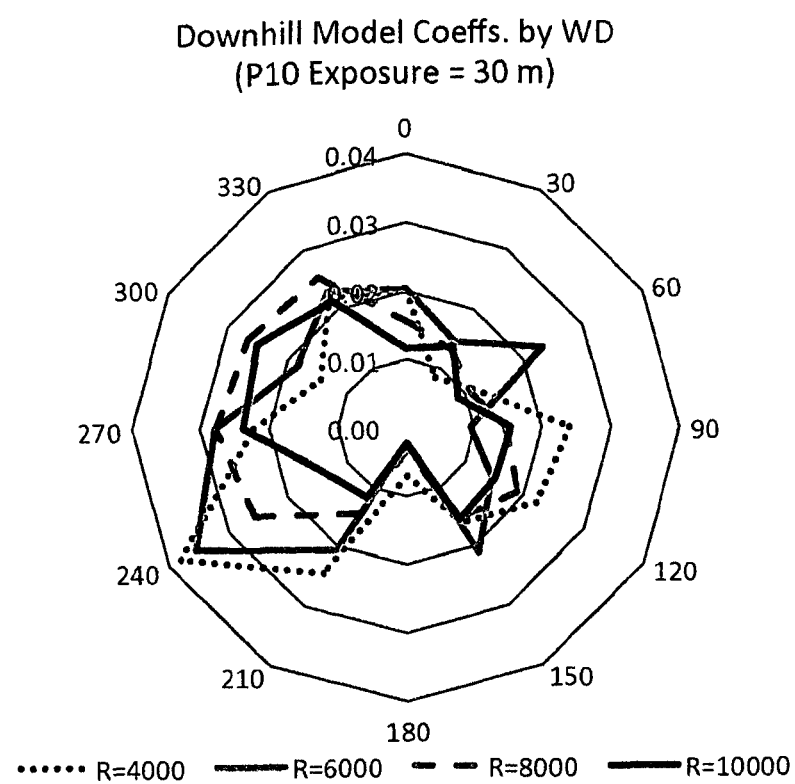
FIG. 7 shows downhill model coefficients by wind direction for a terrain complexity defined by the P10 exposure at 30 m for radii of investigation of 4000 m, 6000 m, 8000 m, and 10000 m.
Figure 8:
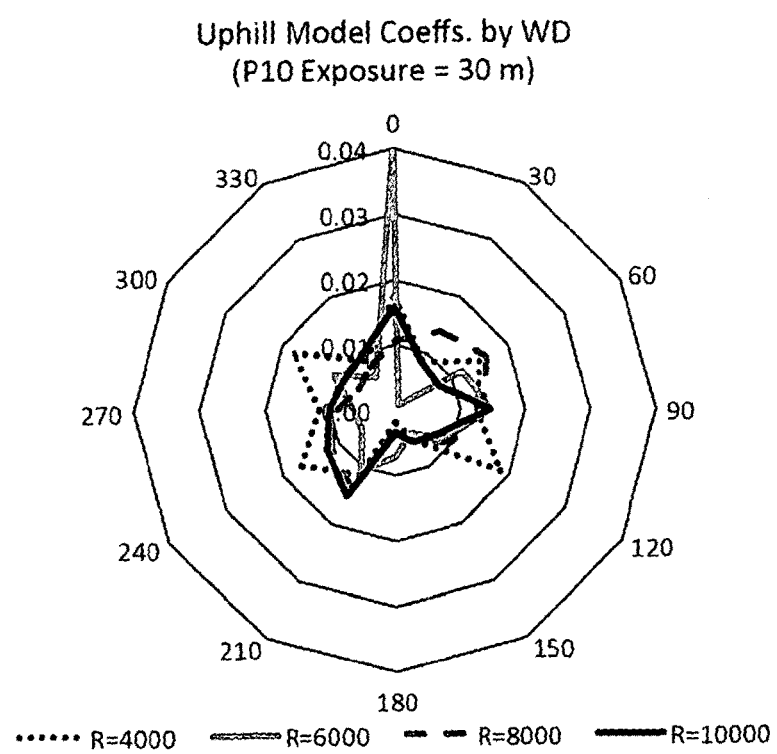
FIG. 8 shows speed-up for when the UW exposure is less than UW critical by wind direction for a terrain complexity defined by the P10 exposure at 30 m for radii of investigation of 4000 m, 6000 m, 8000 m, and 10000 m.
Figure 9:
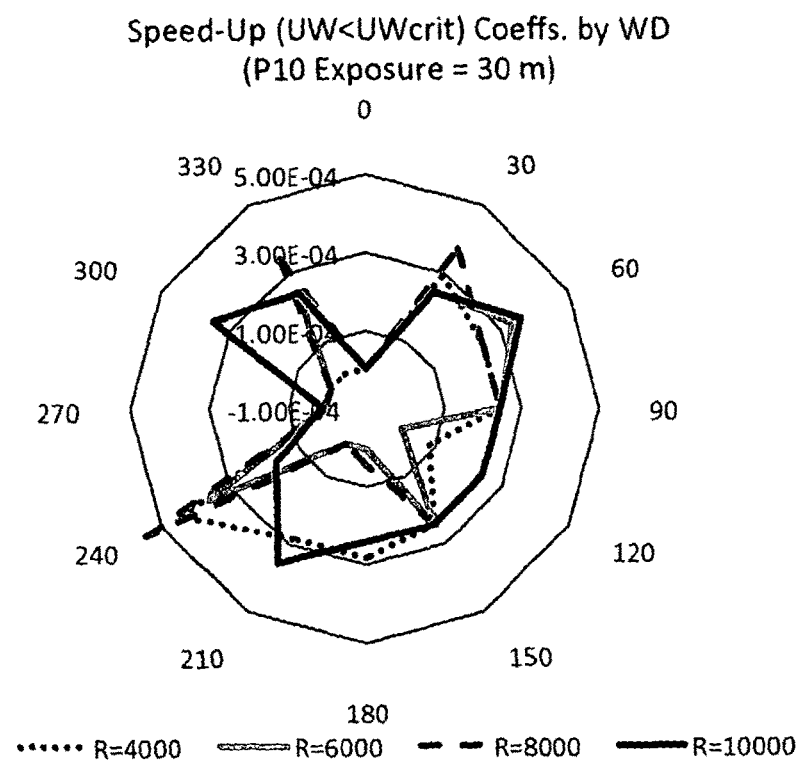
FIG. 9 shows downhill model coefficients by wind direction for a terrain complexity defined by the P10 exposure at 30 m for radii of investigation of 4000 m, 6000 m, 8000 m, and 10000 m.

FIGS. 7, 8, and 9 show the site-calibrated model coefficients as a function of wind direction (at a fixed terrain complexity of P10 Exposure at 30 m) for the four models. As shown in FIG. 7, the west-southwest wind direction sector (240°) yielded the largest downhill coefficient, which was approximately 0.04 (for R=6000 m). The uphill coefficients found through the site-calibration process were lower in magnitude than their downhill counterparts. In general, as shown in FIG. 8, the uphill coefficients were in the range of 0.01 to 0.02. FIG. 9 shows the uphill coefficients when the UW exposure is less than the critical UW exposure and there is induced speed-up over a hill. The magnitude of these coefficients is approximately zero for the wind direction sectors of 270° to 0°, which indicates that there is no induced speed-up due to a hill in these direction sectors. While for the wind direction sectors of 30° to 240°, the induced speed-up coefficients are quite consistent at a magnitude of approximately 4e-5.

Figure 10:
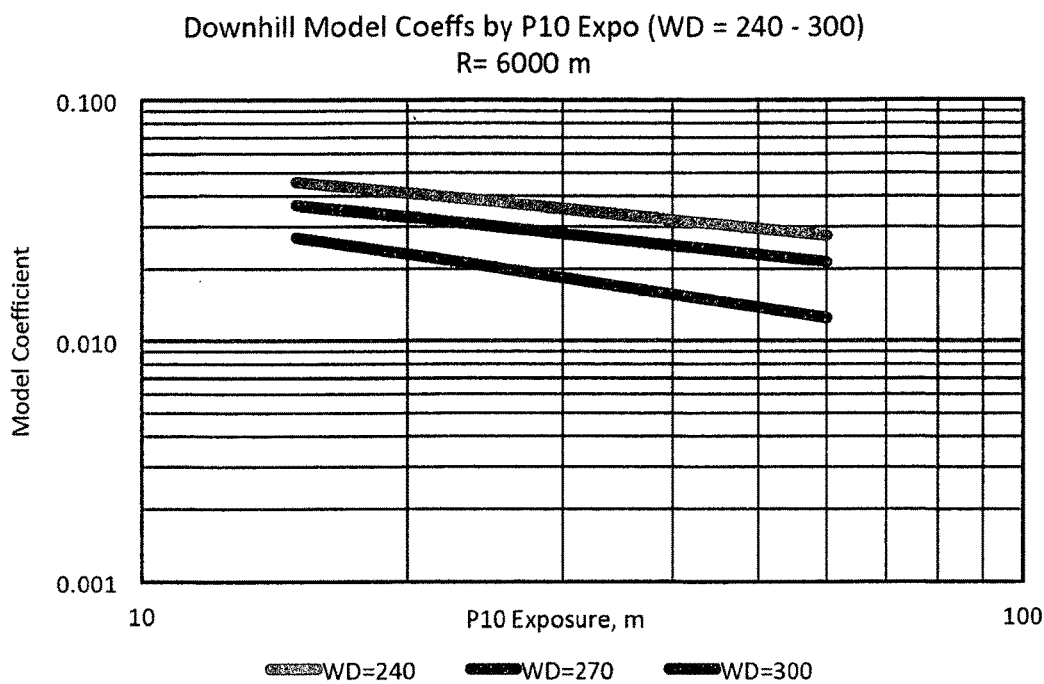
FIG. 10 shows the downhill model coefficients by terrain complexity (P10 exposure) for the sector of wind from 240 degrees to 300 degrees at a radius of investigation of 6000 m.
Figure 11:
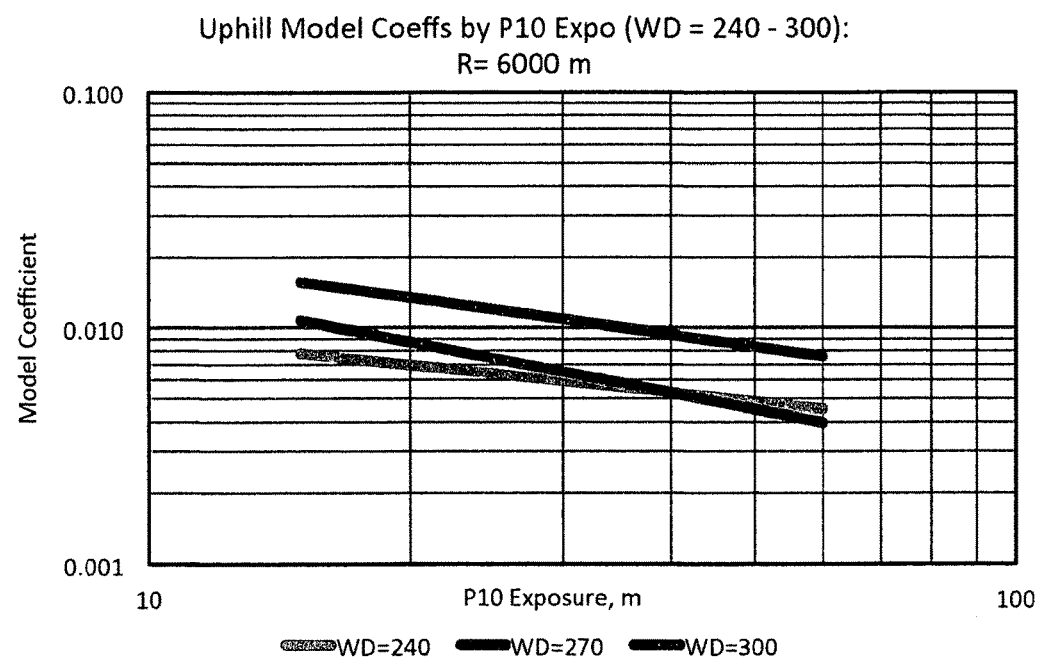
FIG. 11 shows the uphill model coefficients by terrain complexity (P10 exposure) for the sector of wind from 240 degrees to 300 degrees at a radius of investigation of 6000 m.
Figure 12:
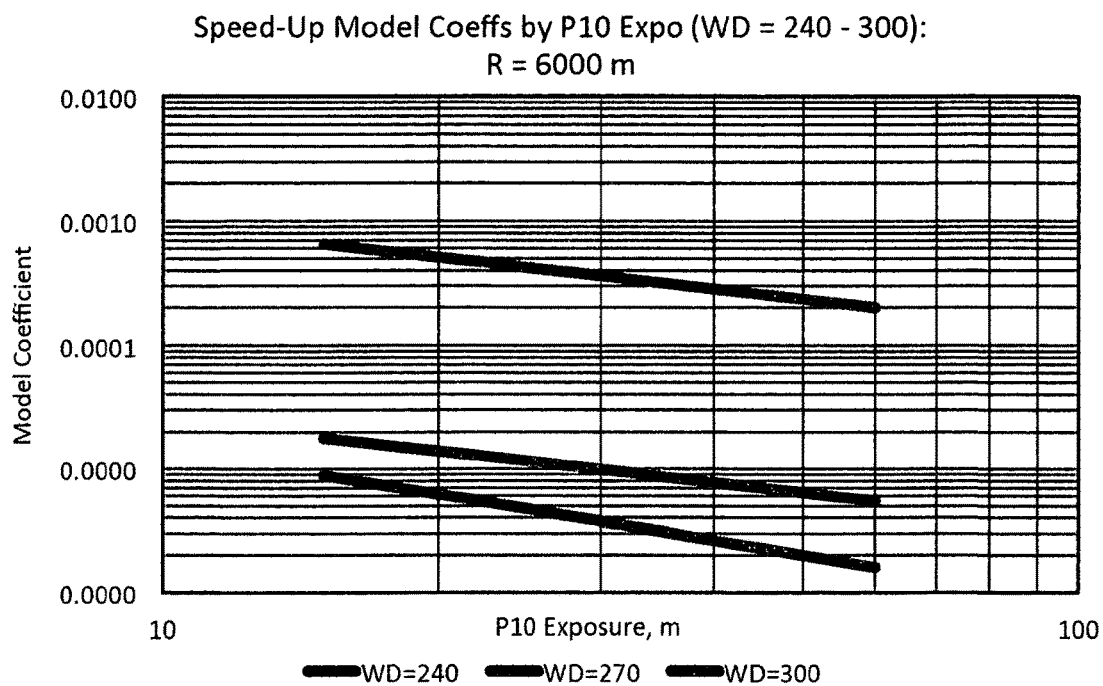
FIG. 12 shows the speed-up model coefficients by terrain complexity (P10 exposure) for the sector of wind from 240 degrees to 300 degrees at a radius of investigation of 6000 m.

The model coefficients for wind direction sectors 240°, 270° and 300° are presented as a function of terrain complexity, here defined as P10 exposure, in FIGS. 10, 11, and 12 for the model that used a radius of 6000 m in the exposure calculation. The site-calibrated model coefficients all showed a dependency on terrain complexity where the coefficients decreased in magnitude as the P10 exposure increased.

Table 1 shows the RMS errors of the met cross-prediction errors for each of the four site-calibrated models. The lowest cross-prediction error was achieved by using a radius of investigation of 6000 m and the RMS error of the met cross-predictions was 1.28%.

TABLE 1

RMS of Met Cross-Prediction Error and Model Weights

| Radius, m | RMSE | Weight |
| --- | --- | --- |
| 4000 | 2.00% | 0.26 |
| 6000 | 1.28% | 1 |
| 8000 | 1.55% | 0.72 |
| 10000 | 2.01% | 0.25 |
| Wgt Avg RMS | 1.53% | |

In the present innovation, wind speed estimates are generated using each of the four models and the estimates are weighted based on the RMS error of the met cross-prediction. The model that used a radius of 6000 m has the highest weight of 1.0 while the model with the lowest weight of 0.25 used a radius of 10,000 m in the exposure calculation.

Figure 13:
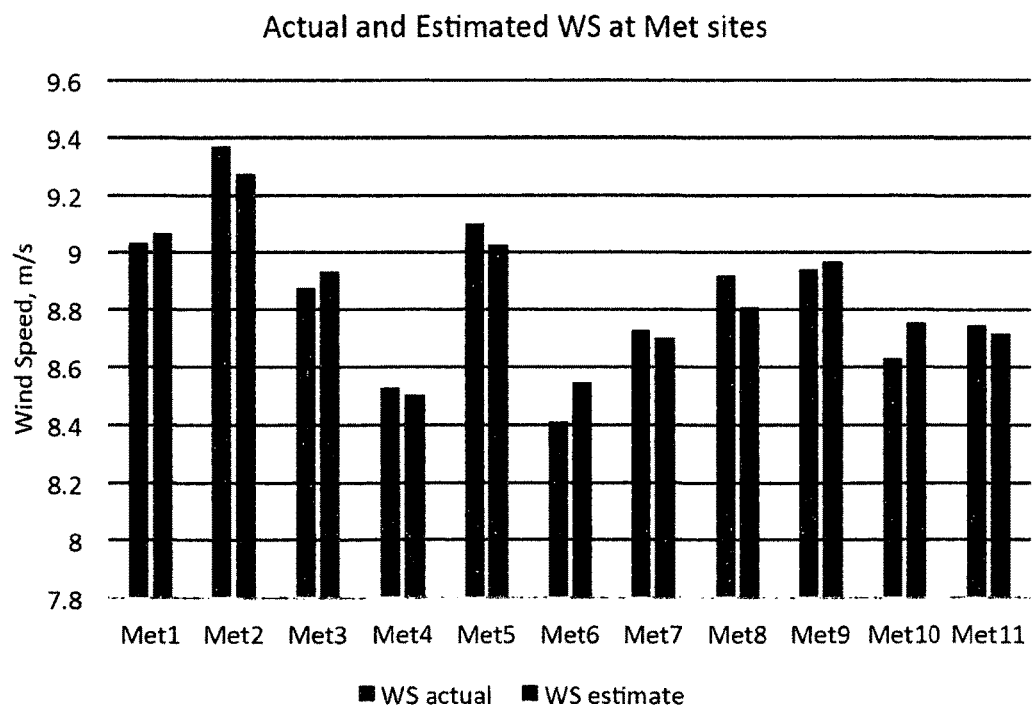
FIG. 13 shows actual wind speeds vs. estimated wind speeds at the met sites for the example.

Using the site-calibrated models and each met site as the predictor, the wind speed was estimated at each met site location and the estimated wind speed ratio was compared to the actual values. FIG. 13 shows the wind speed estimate error at each met site. The largest error was measured at Met 6 with an error of 1.61%. Five of the eleven wind speed estimates showed an error of less than 0.50%, which is within the uncertainty of the measurement devices. The RMS error of the wind speed estimates for this example is very low at 0.90%.

Figure 14:
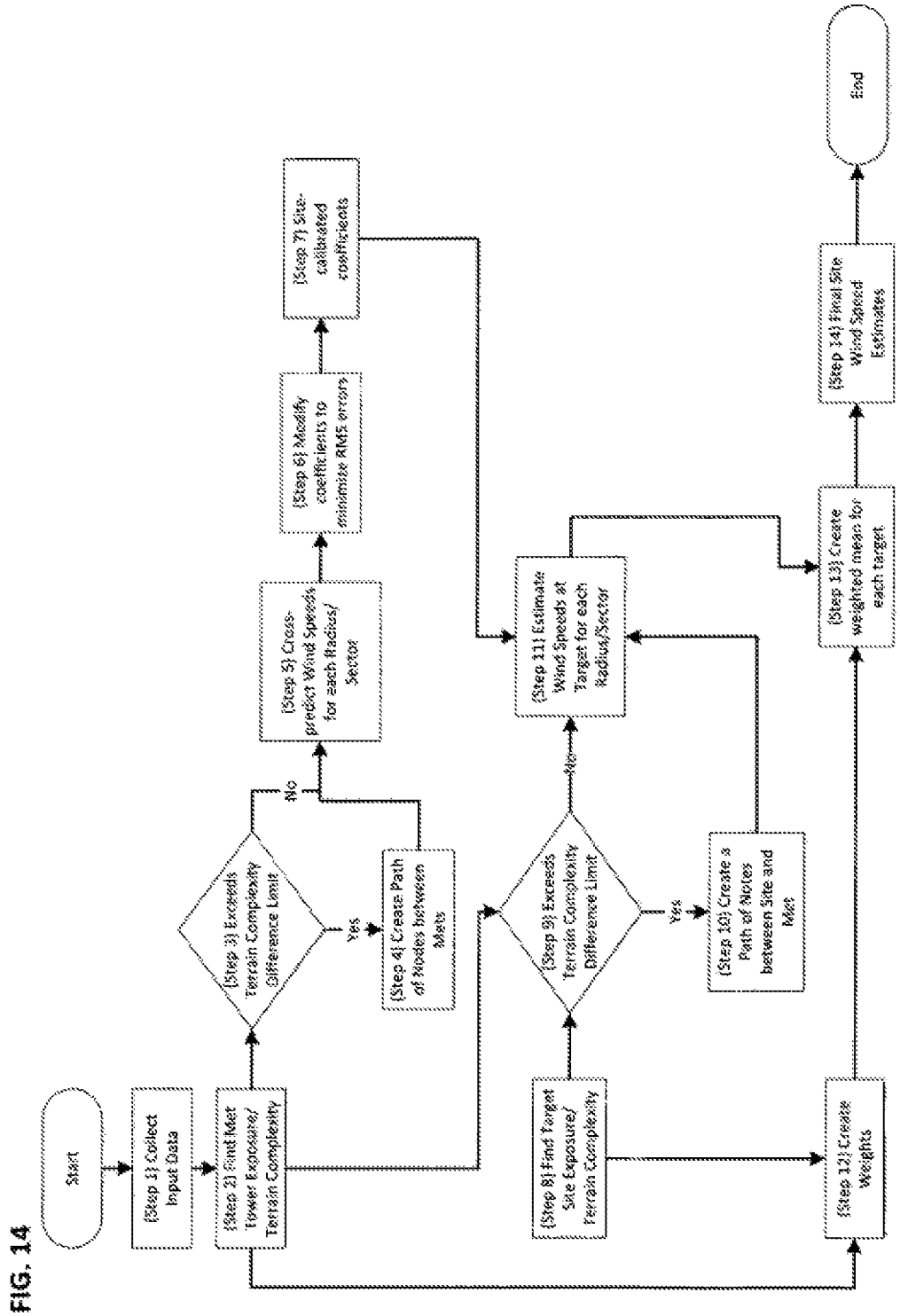
FIG. 14 shows a flow chart of the steps to use the invention.

The following outlines the steps involved in the methodology of the present invention, which is illustrated in FIG. 14. To begin, (Step 1) summary wind data and site data must be input, including: a digital elevation model; multiple radii of investigation (for example: 4000 m, 6000 m, 8000 m, and 10,000 m); and tabular meteorological tower frequency distributions. A meteorological tower wind speed and wind direction frequency distribution tabular file includes spatial information, specifically the locations of the meteorological tower and number of direction sectors (usually 12, 16, or 24 sectors). Note that preparation of input data is not shown in FIG. 14, but is a prerequisite to performing the method shown in FIG. 14.

Next, using the inputs above, the (Step 2) the upwind (UW) & downwind (DW) terrain exposures and the terrain complexity for UW and DW are calculated for each met tower location for each direction sector for each radius of investigation.

For each unique pair of met towers, the (Step 3) difference between the respective UW & DW terrain complexity is examined. If the difference is greater than the maximum predetermined allowable difference, a (Step 4) path of nodes between the two met towers is created using an algorithm with the following parameters:

The change in terrain complexity from node to node is within the maximum predetermined allowable difference between terrain complexity (UW or DW);

Each path of nodes follows the gentlest slope possible between each unique pair of met towers;

The nodes selected are on high ground.

Next, using the digital elevation model, radii of investigation, and direction sectors, the UW & DW terrain exposures and terrain complexity are calculated for each node for each radius of investigation in each direction sector. Using the met tower frequency distributions, default model coefficients, the UW & DW terrain exposures for each node and met tower, and a predetermined UW critical exposure, the (Step 5) wind speeds are cross-predicted for each node and met tower. If the difference between the respective terrain complexities is less than the predetermined maximum allowable difference, no path of nodes is required, and the wind speeds are cross-predicted directly between the met towers.

Using a self-learning algorithm, the (Step 6) RMS errors are minimized by progressively adjusting the model coefficients from their default values. Once the RMS errors are minimized for each cross-prediction, log-log relationships are developed and (Step 7) site-calibrated coefficients have been derived.

Next, the target site locations (turbine locations or other locations, such as a grid of nodes) are input into the model. Using the digital elevation model, radii of investigation, and direction sectors, the (Step 8) UW & DW terrain exposures and terrain complexity are calculated for each target site for each radius of investigation in each direction sector.

For each pair of target site/met tower, the (Step 9) difference between the respective terrain complexity is examined. If the difference is greater than the predetermined maximum allowable difference, a (Step 10) path of nodes between the pair of target site/met tower is created using an algorithm with the following parameters:

The change in terrain complexity from node to node is within the predetermined maximum allowable difference between terrain complexity (UW or DW);

Each path of nodes follows the gentlest slope possible between each pair of target site/met tower;

The nodes selected are on high ground.

If the difference between the respective terrain complexity is less than the maximum allowable difference, no path of nodes is required, and (Step 11) wind speeds are estimated at the target site directly from met tower to site using the site calibrated coefficients, UW & DW terrain exposures, and the target site UW & DW terrain exposures.

For site/met tower combinations that require a path of nodes, the (Step 11) wind speed estimates are derived using the site-calibrated models, UW & DW terrain exposures from the nodes, and the target site UW & DW terrain exposures. This results in different wind speed estimates for each target site (one for each radius of investigation and individual direction sector).

To arrive at the final wind speed estimates at each target site, (Step 12) weights are derived for each estimate derived in the Step 11 by using the site-calibrated models from Step 7, the met tower terrain complexity from Step 2, and the target site terrain complexity from Step 8. The wind speed estimates for each target site at each radii of investigation and each direction sector from Step 11 are then (Step 12) averaged using the derived weights from Step 12 to arrive at the (Step 13) final wind speed estimates at each target site.

Using the parameters outlined herein, the present innovation can predict wind speeds at any desired location on a prospective wind farm site to high level of accuracy. Validation of the model has been conducted and is detailed in *Continuum Wind Flow Model: Introduction to Model Theory and Case Study Review* by Elizabeth Walls, incorporated by reference. Validation includes a Round Robin analysis where one or more met towers are systematically removed from the model, and the wind speeds are predicted at the excluded sites and compared to measured data. The validation revealed the relatively high accuracy of the model.

While an example of the invention has detailed, for those skilled in the art it will be apparent that applications of the model will vary by site depending on the parameters and characteristics of each respective project, however any discrepancy from the provided example may be made without departing from the scope of the invention. Therefore, the invention is not limited to the particular example described and illustrated herein.

What is claimed is:

1. A method of predicting wind speed at one or more target sites comprising the steps of:
measuring a wind speed and a direction at two or more meteorological towers;
defining a location of said one or more target sites;
calculating exposure at the two or more meteorological towers and at said one or more target sites;
using a default wind flow model to predict a wind speed at each of the two or more meteorological towers based on the wind speed measured at a different one of said two or more meteorological towers and difference in exposure between the two or more meteorological towers and calculating an error in the predicted wind speeds for each of the two or more meteorological towers;
altering the default wind flow model based on the calculated errors to derive a site-calibrated wind flow model that results in minimized errors in the predicted wind speeds for each of the two or more meteorological towers; and
applying the site-calibrated wind flow model using the measured wind speed at each of the two or more meteorological towers and difference in exposure between each of the two or more meteorological towers and said one or more target sites to predict a wind speed for said one or more target sites.

2. The method of claim 1, wherein the default wind flow model comprises coefficients relating change in wind speed to change in exposure.

3. The method of claim 2, wherein the default wind flow model comprises different coefficients for uphill wind flow, downhill wind flow, and wind flow speed-up over a hill.

4. The method of claim 2, wherein the default wind flow model comprises coefficients relating change in wind speed to change in upwind exposure and to downwind exposure.

5. The method of claim 4, wherein the default wind flow model comprises different coefficients for uphill wind flow, downhill wind flow, and wind flow speed-up over a hill.

6. The method of claim 1, further comprising the steps of;
calculating terrain complexity at the two or more meteorological towers and at said one or more target sites;
calculating a difference in terrain complexity between the two or more meteorological towers and each other and between the two or more meteorological towers and said one or more target sites;
comparing said differences in terrain complexity to a predetermined value; and
if each of the differences in terrain complexity exceeds the predetermined value, creating a path of nodes between the respective meteorological towers or between a respective meteorological tower and said one or more target sites and calculating a wind speed for each node in the path of nodes.

7. The method of claim 6, wherein the path of nodes is selected to create a path with gradual changes in terrain complexity and elevation along the path of nodes.

8. A method of predicting wind speed at one or more target sites comprising the steps of:
measuring a wind speed and a direction at one or more meteorological towers;
defining a location of said one or more target sites;
calculating exposure at the one or more meteorological towers;
selecting a wind flow model that relates wind speed to exposure, the wind flow model comprising different sets of coefficients for uphill flow, downhill flow, and wind flow speed-up over a hill;
calculating exposure at said one or more target sites;
determining if wind flow is uphill, downhill, or over a hill;
selecting a set of model coefficients based on wind flow; and
applying the wind flow model using the measured wind speed at the one or more meteorological towers and exposure at said one or more target sites to predict a wind speed for said one or more target sites.

9. The method of claim 8, further comprising the step of calculating terrain complexity; and wherein the step of selecting a wind flow model comprises selecting a wind flow model based on terrain complexity.

10. The method of claim 9, wherein the step of selecting a wind flow model based on terrain complexity comprises evaluating a log-log relationship between model coefficients and terrain complexity.

11. The method of claim 9, wherein the terrain complexity is calculated by creating a grid of terrain exposure and selecting exposure values within a predetermined upper percentile within the grid to represent terrain complexity.

12. The method of claim 11, wherein the predetermined upper percentile is a P10 percentile.

13. The method of claim 9, wherein the terrain complexity is compared to a predetermined threshold and if the terrain complexity exceeds the predetermined threshold then creating a path of nodes between the one or more meteorological towers and said one or more target sites and calculating a wind speed for each node in the path of nodes.

14. The method of claim 13, wherein the path of nodes is selected to create a path with gradual changes in terrain complexity and elevation along the path of nodes.

15. A method of predicting wind speed at one or more target sites comprising the steps of:
measuring a wind speed and a direction at one or more meteorological towers;
calculating exposure at the one or more meteorological towers;
calculating terrain complexity;
selecting a wind flow model based on terrain complexity that relates wind speed to exposure the wind flow model comprising different sets of coefficients for uphill flow, downhill flow, and wind flow speed-up over a hill;
calculating exposure at said one or more target sites;
determining if wind flow is uphill, downhill, or over a hill;
selecting a set of model coefficients based on wind flow; and
applying the wind flow model using the measured wind speed at the one or more meteorological towers and exposure at said one or more target sites to predict a wind speed for said one or more target sites.

16. The method of claim 15, wherein the step of selecting a wind flow model based on terrain complexity comprises evaluating a log-log relationship between model coefficients and terrain complexity.

17. The method of claim 15, wherein the terrain complexity is calculated by creating a grid of terrain exposure and selecting exposure values within a predetermined upper percentile within the grid to represent terrain complexity.

18. The method of claim 17, wherein the predetermined upper percentile is a P10 percentile.

19. The method of claim 15, wherein the terrain complexity is compared to a predetermined threshold and if the terrain complexity exceeds the predetermined threshold then creating a path of nodes between the one or more meteorological towers and said one or more target sites and calculating a wind speed for each node in the path of nodes.

20. The method of claim 19, wherein the path of nodes is selected to create a path with gradual changes in terrain complexity and elevation along the path of nodes.

* * * * *